(12) United States Patent
Alcouffe et al.

(10) Patent No.: US 9,733,295 B2
(45) Date of Patent: Aug. 15, 2017

(54) SENSOR CIRCUIT, VEHICLE AND METHOD THEREFOR

(71) Applicants: Benoit Alcouffe, Tournefeuille (FR);
Sebastien Abaziou, Toulouse (FR);
Roberto Velazquez, Chandler, AZ (US)

(72) Inventors: Benoit Alcouffe, Tournefeuille (FR);
Sebastien Abaziou, Toulouse (FR);
Roberto Velazquez, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 125 days.

(21) Appl. No.: 14/702,836

(22) Filed: May 4, 2015

(65) Prior Publication Data

US 2016/0154047 A1 Jun. 2, 2016

(30) Foreign Application Priority Data

Dec. 2, 2014 (WO) .................. PCT/IB2014/002944

(51) Int. Cl.
*G01R 31/02* (2006.01)
*G01R 31/28* (2006.01)
*B60T 8/171* (2006.01)
*G01R 31/00* (2006.01)
*G01P 3/481* (2006.01)

(52) U.S. Cl.
CPC .......... *G01R 31/025* (2013.01); *B60T 8/171* (2013.01); *G01R 31/2829* (2013.01); *B60T 2270/406* (2013.01); *G01P 3/481* (2013.01); *G01R 31/006* (2013.01)

(58) Field of Classification Search
USPC .............. 324/503, 522, 523, 525, 538, 73.1
See application file for complete search history.

(56) References Cited

U.S. PATENT DOCUMENTS

| | | | |
|---|---|---|---|
| 5,406,485 A | 4/1995 | Wise et al. | |
| 5,483,817 A | 1/1996 | Renard et al. | |
| 5,510,707 A | 4/1996 | Caron | |
| 7,532,010 B2 | 5/2009 | Kamel et al. | |
| 2003/0030446 A1* | 2/2003 | Wang ............... | G01F 15/12 324/525 |

(Continued)

FOREIGN PATENT DOCUMENTS

CN 103808964 A 5/2014

OTHER PUBLICATIONS

U.S. Appl. No. 14/702,824, filed May 4, 2015, entitled "Sensor Circuit, Vehicle and Method Therefor".

(Continued)

*Primary Examiner* — Vincent Q Nguyen
(74) *Attorney, Agent, or Firm* — Charlene R. Jacobsen

(57) ABSTRACT

A sensor circuit, including at least a first sensor arranged to selectively receive a first test current; a first digital-to-analog converter, DAC, arranged to receive a first signal from the first sensor and output a first compensation signal in response thereto; a second DAC arranged to receive a second signal from a second sensor and output a second compensation signal in response thereto; and a controller operably coupled to the first and second DACs and operable to determine from at least one of: the first compensation signal and second compensation signal whether a short condition exists between the first sensor and the second sensor.

16 Claims, 9 Drawing Sheets

(56) References Cited

U.S. PATENT DOCUMENTS

2003/0226702 A1\* 12/2003 Imai .................. B60K 23/0808
    180/247
2011/0057707 A1\* 3/2011 Bronczyk ............ G01R 31/025
    327/332
2013/0207665 A1 8/2013 Bandyopadhyay et al.

OTHER PUBLICATIONS

Non Final Office action for U.S. Appl. No. 14/702,824; 24 pages (dated Feb. 17, 2017).

\* cited by examiner

FIG. 1 – Prior art

SENSOR CIRCUIT, VEHICLE AND METHOD THEREFOR

CROSS REFERENCE TO RELATED APPLICATION(S)

The present application claims priority to International Patent Application No. PCT/IB2014/002944, entitled "SENSOR CIRCUIT, VEHICLE AND METHOD THEREFOR," filed on Dec. 2, 2014, and is related to co-pending U.S. patent application Ser. No. 14/702,824, entitled "SENSOR CIRCUIT, VEHICLE AND METHOD THEREFOR," filed on May 4, 2015, the entirety of which are herein incorporated by reference.

FIELD OF THE INVENTION

The field of this invention relates to a sensor circuit, a vehicle and method therefor, and in particular for short circuit detection between wheel-speed sensors and/or channels in an automotive application.

BACKGROUND OF THE INVENTION

Sensor circuits include sensor devices that respond to an input quantity by generating a functionally related output, usually in the form of an electrical or optical signal. A sensor is a device that detects events or changes in quantities and provides a corresponding output, generally as an electrical or optical signal. A sensor device's sensitivity is generally indicative of how much the sensors output changes when the measured quantity changes.

Sensors are used in everyday objects such as touch-sensitive elevator buttons (tactile sensor) and lamps that dim or brighten by touching the base, besides innumerable applications of which most people are never aware. In recent years, the use of sensors has extended beyond the more traditional fields of temperature, pressure or flow measurement, for example into automotive vehicle control systems comprising wheel-speed sensors.

In automotive vehicle control systems, it is known to use wheel speed sensors to obtain and utilise wheel speed information for use in controlling functions, such as, anti-lock brake system (ABS) or traction control. An ABS wheel-speed sensor system measures a speed of a vehicle's wheels and converts an analog sensor signal to a digital signal for processing by an ABS controller. The ABS controller monitors and compares speed information from all four wheels. If the signal from one wheel changes abruptly with respect to the other wheels, the ABS controller understands that the wheel is beginning to lose traction. It then takes the appropriate action by applying the brakes or performing traction control. In such automotive vehicle control systems, each wheel speed sensor has a separate channel for processing the respective wheel speed.

Referring to FIG. 1, U.S. Pat. No. 5,406,485A illustrates a known wheel speed sensor circuit 150 comprising, a wheel speed sensor 18 operably coupled to an instrumentation amplifier 72. The instrumentation amplifier 72 has two input operational amplifiers 74 and 76, wherein each of the operational amplifiers 74 and 76 has one input connected to a respective sensor output lead 28, 29, and an output operational amplifier 78, having inputs coupled to the two input operational amplifiers 74 and 76 and to a positive bias voltage Vref. The output 80 of the output operational amplifier 78 comprises an alternating sensor differential voltage imposed on the voltage Vref, which assures that the output 80 will remain in a positive range.

FIG. 1 also illustrates a voltage divider 84 between Vcc and ground with six intermediate voltage taps. Vcc and the three highest taps are coupled to each of a first pair of analog switches 86 and 88, while the three lowest taps and ground are coupled to each of a second pair of analog switches 90 and 92. Each of the analog switches 86-92 also has two control inputs 94 responsive to control bits stored in registers by a central processing unit (CPU) for selecting which of the input voltages is selected as an output. The outputs of analog switches 86 and 90 provide high and low threshold voltages to a window comparator 96. The window comparator 96 input is the common mode voltage (Vcm) from the instrumentation amplifier 72. The window comparator 96 output signifies a short condition, and is coupled via line 34 to a fault timing and latching circuit 36 and to a disable function of an A/D converter 32. The output of analog switch 88 becomes a threshold voltage for a comparator 98 having the sensor high lead voltage on line 28 as its other input. Likewise, the output of analog switch 92 is a threshold voltage for a comparator 100, which has the sensor low voltage on line 29 as its input. An AND gate 102 has inputs coupled to the comparators 98 and 100 and an output to the fault timing circuit 36 for indicating an open circuit condition.

The fault timing circuit 36 has separate timeout settings, both programmable by software, for short and open conditions, and latches a fault when a respective open or short condition exceeds a time limit. The range of selectable timeout periods for a short fault is between 15 and 244 micro-seconds, and the range of timeouts for an open fault is between 4 and 500 milli-seconds. For diagnosing shorts during vehicle operation, the short timeout may be set about 100 micro-seconds.

In operation, the wheel speed sensor 18 is biased by pulling up the sensor output lead 28 to Vcc and pulling down the sensor output lead 29 to ground. If the sensor becomes open circuited, the high lead 28 will transition towards Vcc and the low sensor output lead 29 will transition towards ground and stay there. The lead voltages are monitored by the comparators 98 and 100. When the high sensor output lead 28 voltage transitions above the comparator 98 threshold and the low sensor output lead 29 voltage transitions below the comparator 100 threshold, both comparators turn 'on' to send an open indication to the fault timing circuit 36 via AND gate 102, and the timeout period begins. If the timeout expires, an open circuit fault is latched.

In order to detect a short to ground or a battery, the window comparator 96 compares Vcm to the high and the low thresholds. If either threshold is violated, the output of the window comparator signifies a short condition and the timer for a short condition begins. If the short timeout period expires, a short fault is latched.

Therefore, the sensor circuit 150 is operable to detect a short circuit condition for an individual wheel speed sensor 18, wherein the short circuit condition relates solely to either a short between the wheel speed sensor 18 and ground, or between the wheel speed sensor 18 and a battery.

U.S. Pat. Nos. 5,510,707 and 7,532,010 also describe techniques to identify a short circuit to ground in a test mode when the vehicle is (and therefore the wheels connected to wheel speed sensors are) at rest.

For safety purposes, particularly in automotive applications, it is desirable to detect all possible faults in all possible operational conditions.

SUMMARY OF THE INVENTION

The present invention provides a sensor circuit, a vehicle that has a moving state in which the sensor circuit operates, and a method for detecting a short circuit in a sensor application, for example a wheel speed sensor application, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Although some examples of the invention have been described with reference to wheel speed sensors in a wheel speed sensor circuit, it is envisaged that this is simply one application that may benefit from the invention. In other example embodiments, the inventive concept may be applied to any sensor circuit comprising a plurality of sensors that requires detection of a short condition between sensors.

Figure 2:
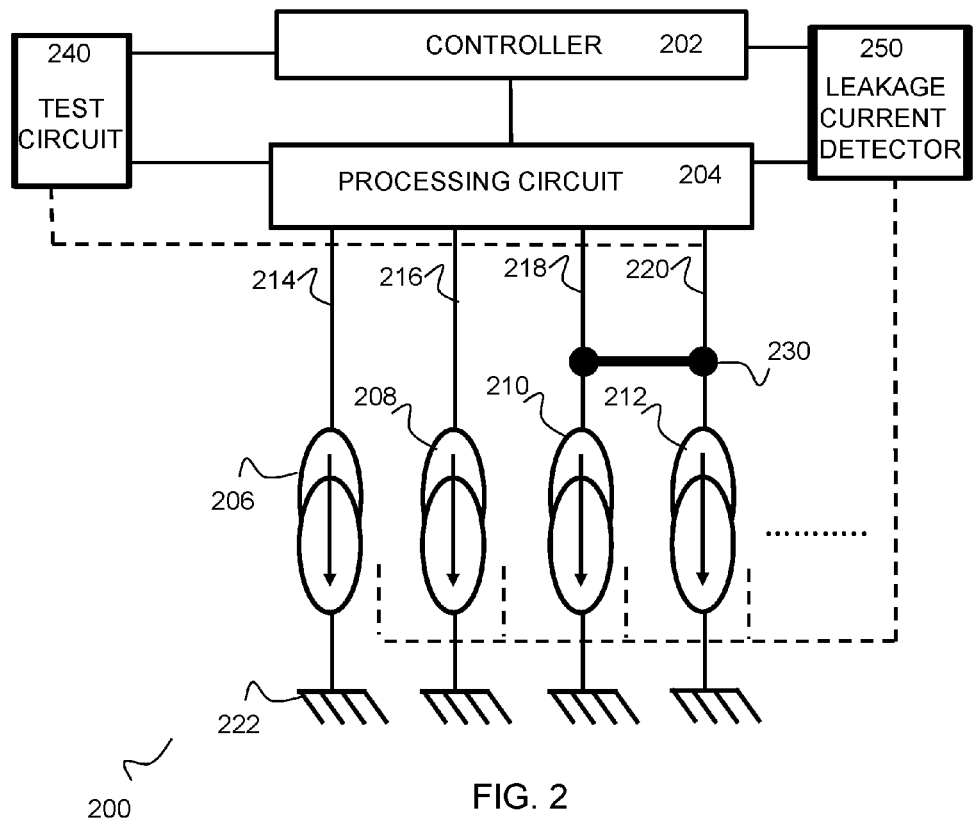
FIG. 2 illustrates an example of a sensing circuit.

Referring to FIG. 2, an example of a sensing circuit 200 illustrates a sensor circuit capable of detecting a short condition between two (or more) sensors and/or two (or more) sensor channels. In this example, the sensing circuit 200 may comprise a controller 202, such as an electronic control unit or control module, operably coupled to (or in some examples housing) a signal processing circuit 204. The signal processing circuit 204 may be operably coupled to a number of individual sensors 206, 208, 210, 212, for example a number of individual wheel speed sensors for a vehicular application. In some examples, the signal processing circuit 204 receives and processes a periodic sensor signal from each of the individual sensors 206, 208, 210, 212. In this example, each individual sensor 206, 208, 210, 212 may be operably coupled to the signal processing circuit 204 via separate channels 214, 216, 218, 220. In this example, each individual sensor 206, 208, 210, 212 may be a hall-effect sensor, for example. In some examples, the signal processing circuit 204 may comprise a number of signal processing circuits or processors, for example one signal processing circuit or processor per sensor 206, 208, 210, 212.

In some examples, the controller 202 and/or signal processing circuit 204 and each individual sensor 206, 208, 210, 212 may be operably coupled to a leakage current detector 250, which in some examples may comprise a set of individual leakage current detectors, for example one leakage current detector per sensor 206, 208, 210, 212. In some examples, the leakage current detector 250 connected to one or more sensors 206, 208, 210, 212 is arranged to detect a leakage current of the sensors and output, in response thereto, a compensation signal for compensating for the leakage current to the signal processing circuit 204. In some examples, the signal processing circuit 204 may comprise the leakage current detector 250.

In some examples, the controller 202 and/or signal processing circuit 204 and each individual sensor 206, 208, 210, 212 may be operably coupled to a test circuit for injecting a test current into a selected one of the sensors 206, 208, 210, 212.

As shown in this example, a 'short-circuit' condition 230 (sometimes referred to as a 'short' condition) may occur between at least two of the number of individual sensors 206, 208, 210, 212. In this example, the short condition 230 has been illustrated between the third sensor 210 and fourth sensor 212 and/or may be considered as a short between third channel 218 and fourth channel 220.

In some sensor applications, for example with anti-lock braking systems (ABS) or traction control systems (ESP), it is important to be able to individually interrogate each of the number of individual sensors 206, 208, 210, 212. The short condition 230 that may occur between third sensor 210 and fourth sensor 212 may cause an incorrect value to be decoded by the controller 202 or signal processing circuit 204. Therefore, in some examples, the short condition 230 between third sensor 210 and fourth sensor 212 may cause an error within the sensing circuit 200. A skilled artisan will appreciate that the circuit of FIG. 2 is a diagrammatic representation, and in practice one channel, such as fourth channel 220, could readily develop a short with one or more other channels, and not just the adjacent illustrated third channel 218.

Figure 1:
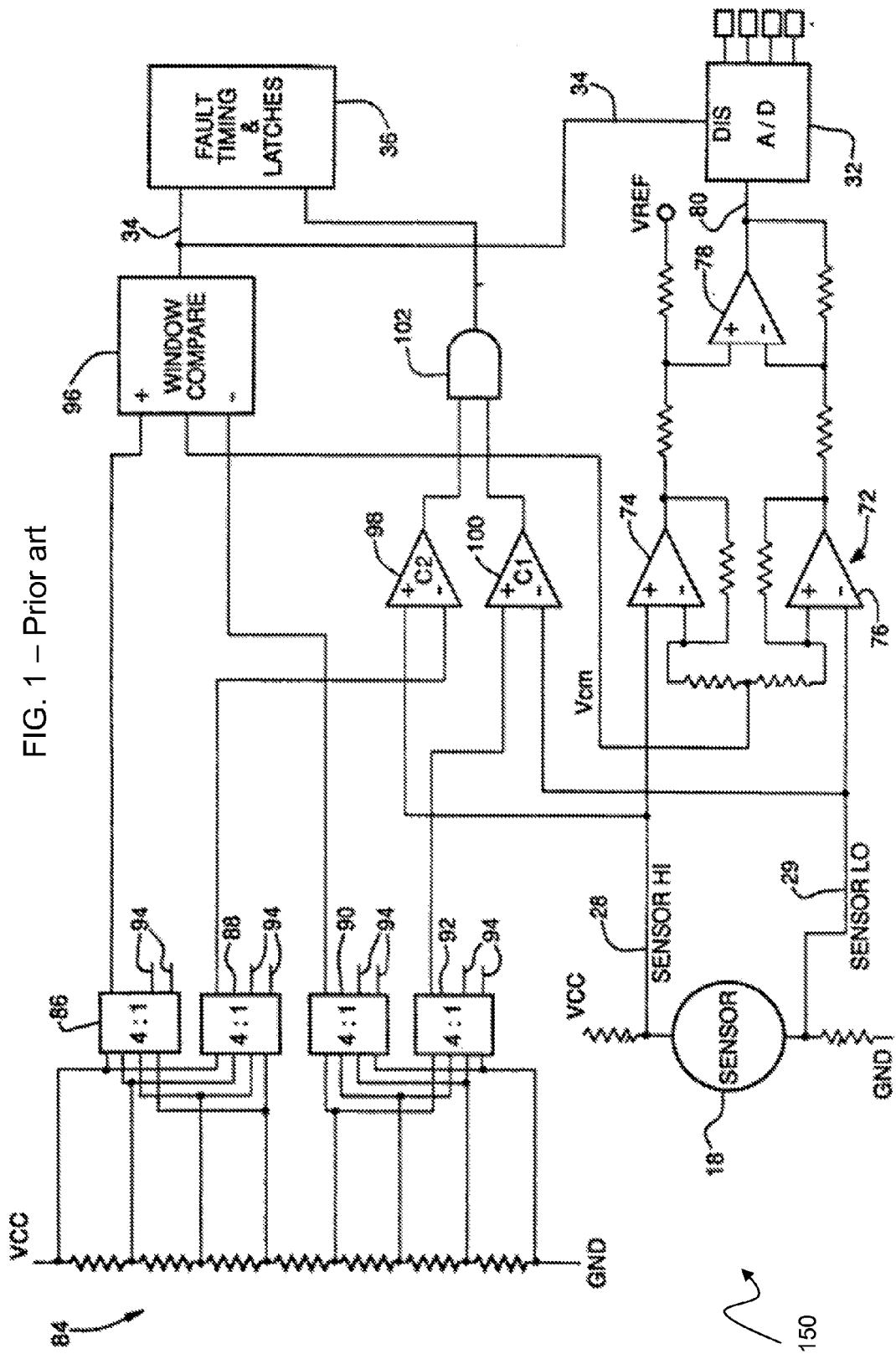
FIG. 1 illustrates a known schematic diagram of a circuit for a wheel speed sensor application.

The inventors have recognised and appreciated that the known prior art sensor circuit, for example the sensor circuit 150 from FIG. 1, is incapable of detecting such a short condition 230, which may occur between at least two separate individual channels and/or between separate individual sensors. This is partly due to prior art sensing circuits only being concerned with detecting short conditions for an individual sensor between the individual sensor and ground, and not 'between' individual sensors and/or channels, and often in a static (i.e. non-mobile) state.

Herein, the detecting of such a short condition between either at least two separate individual channels 214, 216, 218, 220 and/or between separate individual sensors 206, 208, 210, 212 are to be viewed interchangeably, inasmuch as a short between sensors or channels will be equally discernible.

In contrast to the known art, examples of sensing circuit 200, and particularly controller 202, are herein described and have been adapted and configured to identify an existence of a 'short-circuit' condition 230 between multiple sensors and/or channels. In some examples, the controller 202 determines from the compensation signal of at least one of the leakage current detectors, whether a short condition exists between at least two of the sensors.

In examples of the invention, the sensor circuit 200 may be a wheel speed sensor circuit, and the test circuit 240 connected to the sensors may be configured to inject a test current into a selected one of the sensors whilst the wheel is in motion. In this manner, the test circuit 240 of the sensor circuit 200 may be able to apply a test current to a specific sensor 206, 208, 210, 212, for example in a running or operational mode, which additionally modifies the leakage current that is output from the specific sensor. This detected modified leakage current forces a change (for example via a digital-to-analog converter (DAC)) to a compensation signal. Monitoring of the current output from the sensor that the test signal is applied to, or any other sensor, may provide an indication that a short exists if there is a corresponding change in current or an unbalanced current monitored from one of the sensors.

Figure 3:
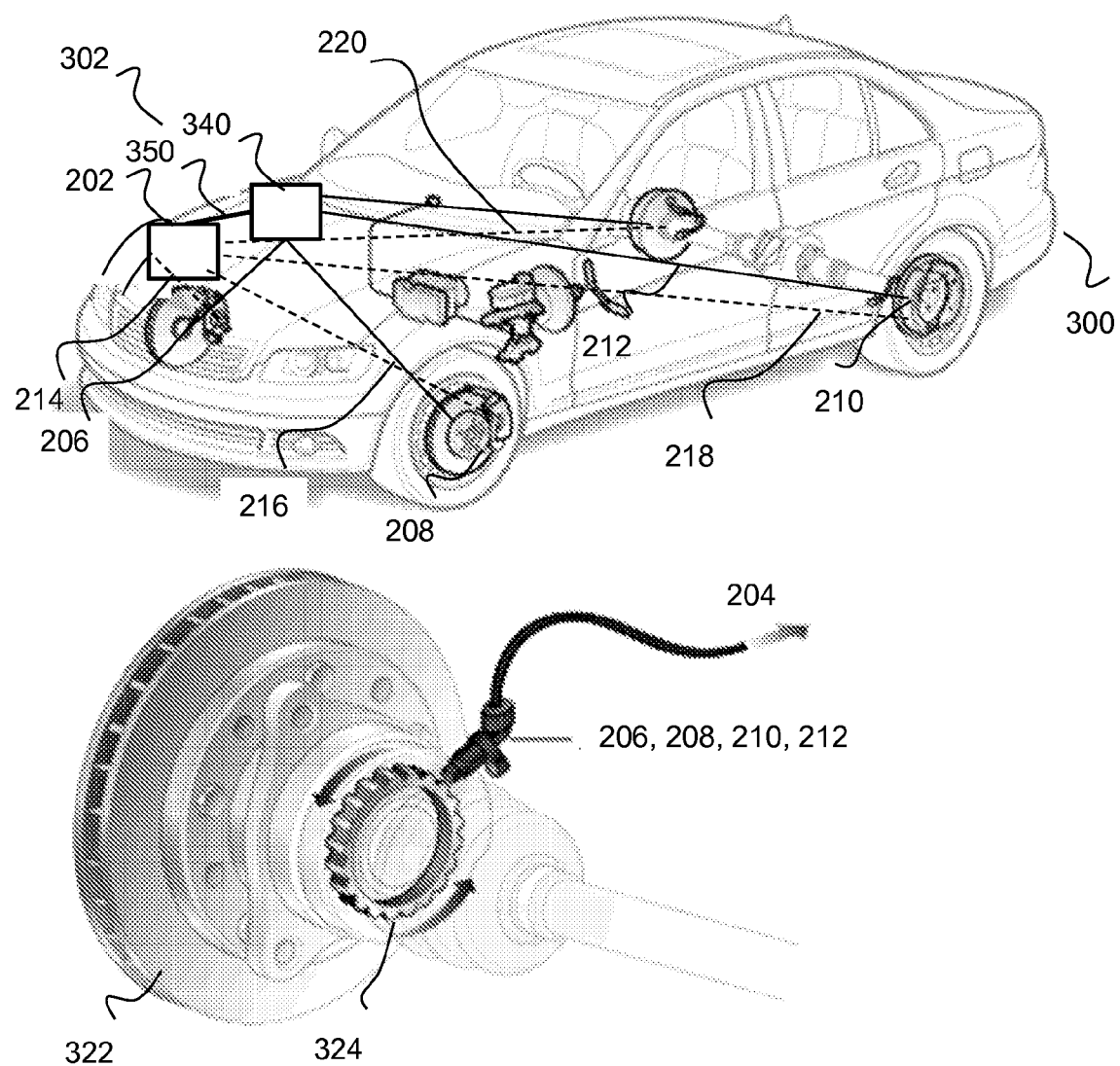
FIG. 3 illustrates an example of a vehicle with a wheel-speed sensor circuit.

FIG. 3 illustrates an example of a vehicle 300 with a wheel-speed sensor circuit 302, for example for use in an anti-lock braking system (ABS). The ABS wheel-speed sensor circuit 302 measures a speed of each of the vehicle's wheels. The example wheel-speed sensor circuit 302 of a vehicle 300 comprises a number of individual sensors 206, 208, 210, 212 operably coupled to controller 202 via separate respective channels 214, 216, 218, 220. The controller 202 is also operably coupled to a modulator 340 via a connection 350.

In operation, the controller 202 monitors and compares speed information from all four wheels via individual sensors 206, 208, 210, 212. If the signal from one wheel changes abruptly with respect to the other wheels, the controller 202 understands that the wheel is beginning to lose traction. The controller 202 can then take the appropriate action by applying pressure to the brakes 322 or traction control via, say, a control signal sent to modulator 340. Thus, in this example, the modulator 340 is also operably coupled to each of the wheels and arranged to control the braking of each wheel according to one or more respective control signal(s) received from controller 202.

In operation, in one example, wheel speed conditioning of signals from active sensors, e.g. individual sensors 206, 208, 210, 212, may be employed by controller 202 in order to determine whether a short condition exists between two sensors or sensor channels.

The digital input signal of an active sensor is a rectangular signal with a variable pulse width. In some examples, in a vehicular application, wheel speed conditioning may output currents of two nominal levels (for example 7 mA or 14 mA for a Type2 sensor) or three nominal levels (7 mA or 14 mA or 28 mA for a Type3 sensor), in a pulsed manner. In some examples, this rectangular signal with a variable pulse width may be interpreted as a digital signal, for example by a digital to analog converter.

Figure 4:
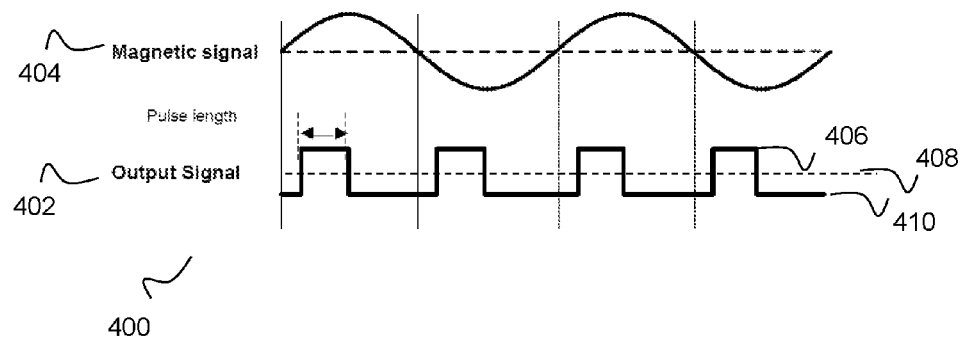
FIG. 4 illustrates an example of signals employed in a wheel-speed sensor circuit on a vehicle.

The example wheel-speed sensor circuit 302 of a vehicle 300 comprises a number of gear-shaped rotor 324 operably coupled to a respective sensor 206, 208, 210, 212 located at each wheel. Each gear-shaped rotor 324 spins at a frequency that is substantially proportional (or equal) to a rotation of a wheel attached to the gear-shaped rotor 324. In this example, each sensor 206, 208, 210, 212 may comprise a permanent magnet with a coil wrapped around it, which acts as a magnetic pickup that reads a position of the teeth on the gear-shaped rotor 324. When a tooth passes the iron core, the magnetic lines of force cut through the coil windings causing a positive voltage to be induced on the coil. When the tooth is centered on the iron core the magnetic field does not move and zero volts are induced on the coil. As the tooth moves away from the iron core the magnetic field expands, resulting in a negative voltage. An outcome of this effect, in one example, is an alternating current pattern (or voltage signal) as shown in FIG. 4. As the rotation speed of the gear-shaped rotor 324 increases, the voltage and frequency of the signal also increases, thereby indicating a faster wheel speed to the controller 202.

Thus, in this example, each of the number of individual sensors 206, 208, 210, 212 may be operable to generate a current waveform that is representative of a position of a toothed wheel operably coupled to a wheel of a moving vehicle, as illustrated in FIG. 4. In some other examples, at least two of the sensors, for example sensors 206, 208, may be utilised, for example for a two-wheel drive vehicle. In some other examples, more than four sensors (and therefore channels) may be utilised, for example for a lorry or truck with more than four wheels.

FIG. 4 illustrates an example of signals 400 employed in a wheel-speed sensor circuit on a vehicle, for example vehicle 300 of FIG. 3. If the wheel of a vehicle is in motion, the position of the teeth of the toothed wheel, coupled to the wheel of the moving vehicle and relative to one of the individual sensors, such as individual sensors 206, 208, 210, 212 of FIG. 3, change. Therefore, as each tooth passes one of the individual sensors 206, 208, 210, 212, a current frame may be generated, thereby resulting in a rectangular wave output 402, wherein each edge of the rectangular wave signal represents a tooth edge on, say, the gear-shaped rotor 324 of FIG. 3. Thus, in some examples, a period of the rectangular wave output may be utilised to determine a wheel speed of the vehicle.

In this example, each sensor 206, 208, 210, 212 converts the magnetic signal 404 into a rectangular pulse signal 402 at a frequency according to the respective wheel speed. In this example, at each HIGH pulse 406, the individual sensor 206, 208, 210, 212 draws 14 mA from a vehicle battery, whereas in an output LOW state 410 7 mA is drawn. The controller, for example controller 202 from FIG. 2 or FIG. 3, compares these current levels to, say a threshold level of, say, 10 mA 408 in order to determine whether the output signal is a HIGH pulse 406 or in a LOW state 410. In some examples, the threshold level(s) may be internally generated by the controller 202.

In one example a 10 mA threshold may be employed for a Type2 sensor. In one example a 20 mA threshold may be employed for a Type3 sensor. In some examples, the employed thresholds may be adjusted to take into account sensor leakage current due to aging. Such adjustments may be implemented by modifying a reference signal level applied to a comparator. In some examples, a variation of the reference signal level may be constrained within specified limits, to ensure that the interpretation of the comparator output is representative of the sensor circuit's current operation, and in this example represent, say, a change in wheel speed sensor leakage current. In this regard, the variation of the reference signal may be limited to threshold current between a range of, for example 8.75 mA to 11.75 mA with a typical nominal value of 10.25 mA for a Type2 sensor, or a range of, for example 17 mA to 23 mA with a typical value of 20 mA for a Type3 sensor.

In some examples, the controller 202 may determine a duty cycle (period) associated with the rectangular signal that is output from the sensor. In this manner, if a sensor output current is determined as being above or below the threshold for a specific period of time, the sensor output current may be deemed to be a high pulse or a respective low pulse.

In some examples, in addition to vehicle speed, other information may be transmitted by the controller 202, for example dependent upon the type of sensor employed. For example, the sensors may be:

(i) a Type1 sensor may transmit only wheel speed information, without coding and with an output signal having a 50% duty cycle and varying between 7 mA to 14 mA;

(ii) a Type2: sensor may transmit only wheel speed, direction and fault mode information using pulse width modulated (PWM) encoded information and an output signal with a variable duty cycle and varying between 7 mA to 14 mA; and (iii) a Type3 sensor may transmit using pulse encoded information (e.g. Manchester coding), with an output signal of multiple pulses (say, a maximum number of nine pulses varying between 7 mA to 28 mA.

In one example, for say the Type2 sensor, each zero crossing of magnetic signal 404 may trigger an output pulse within output signal 402. In addition to indicating a speed of motion of a vehicle, further information may be provided by varying a length of the output pulse. For example, each duty cycle of a Type2 sensor and, say, the Manchester code of a Type3 sensor may be used to represent a wheel direction and one or more fault modes of each wheel that the sensor is coupled to.

Figure 5:
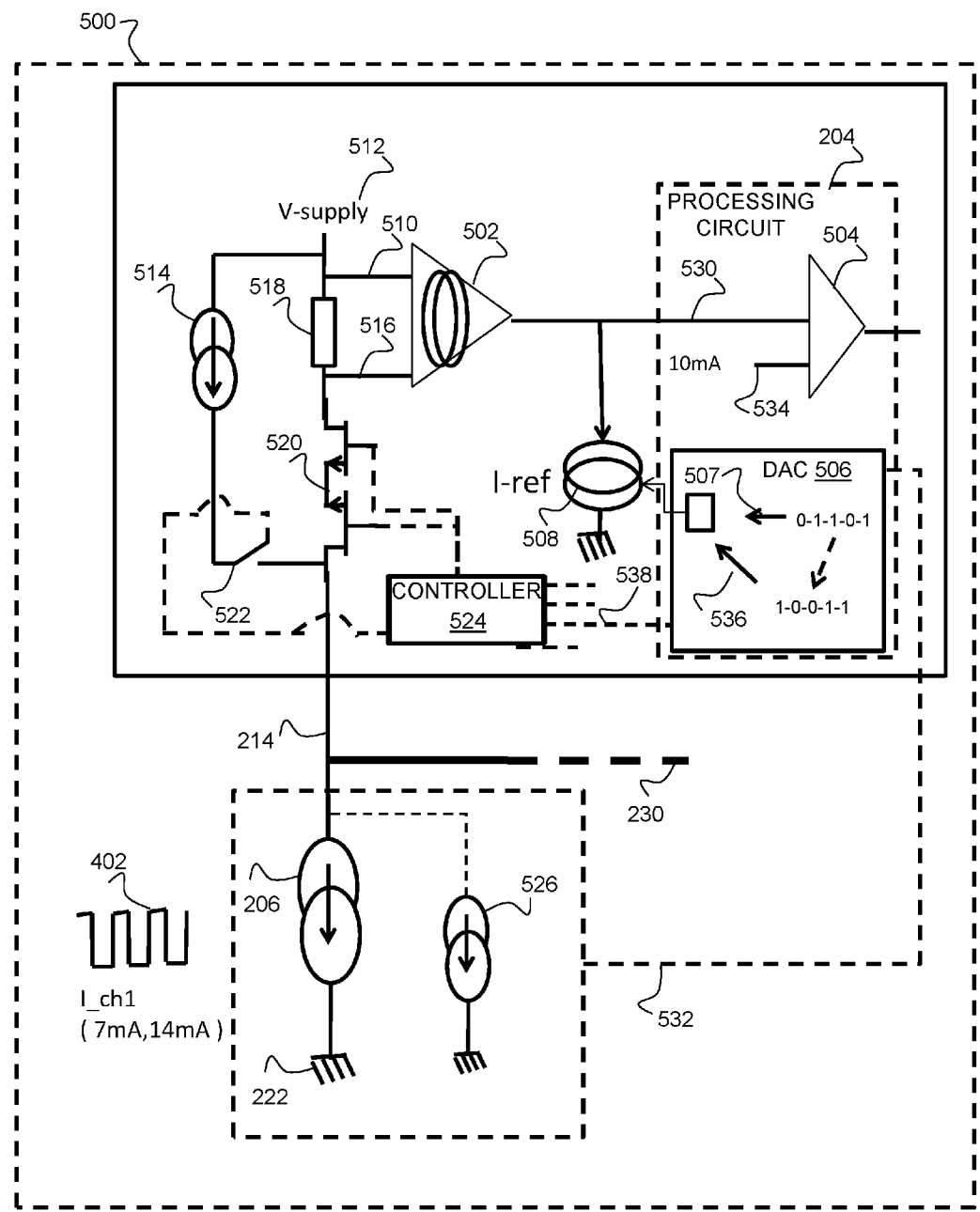
FIG. 5 illustrates a further example of a sensing circuit.

Referring to FIG. 5, an example of a sensing circuit 500 is illustrated. In this example, the sensing circuit 500 may be employed in a vehicle, such as vehicle 300 from FIG. 3, as a wheel speed sensor circuit. In this example, part of a single sensing circuit 500 may be operably coupled to an individual sensor, for example individual sensor 206 from FIG. 2 via channel 214. In some examples, the vehicle may comprise multiple similar sensing circuits 500 coupled to other individual sensors, for example via other channels (not shown). Thus, in this wheel speed sensor example, a similar sensing circuit 500 may be utilised for each of the other number of individual sensors 208, 210, 212 from FIG. 2, for example.

In this example, the sensing circuit 500 may comprise a current amplifier 502, for example a current amplifier, operably coupled at its output to an input of a comparator 504, and to a current source, e.g. represented by current source 'I-ref' 508. The output from current source 'I-ref' 508 is controlled by a level controller, which in this example comprises an analog output control signal from digital-to-analog converter (DAC) 506, which receives a rectangular wave (representing a digital signal) input from the sensor 206. In other examples, the level controller may comprise any suitable component or circuit that is capable of monitoring a variation in current output from a sensor, particularly in response to an injected test current. The DAC 506 in this example is a 5-bit DAC, thereby being able to represent thirty-two different digital current levels in the sensor leakage current output 532 in order to compensate for any associated leakage current of the sensor output. In some other examples, the DAC 506 may comprise any number of bits that are necessary to represent the sensor leakage current output 532 and create a suitably compensated current value, with the number of bits used being representative of the application being sensed.

A first input 510 of the current amplifier 502 is operably coupled to a supply voltage 512 and to a first terminal of a source providing a test current 514. A second input 516 of the current amplifier 502 may be operably coupled to the first input 510 via a resistive device 518, and to a first terminal of a switching device 520. In some examples, the switching device 520 may be a semiconductor switching device, for example a metal oxide semiconductor field effect transistor (MOSFET). A second terminal of the switching device 520 may be selectively operably coupled, via a switch 522, to a second terminal of the test circuit connected to the sensor(s) of the set for injecting a test current 514 into a selected one of the sensors. In some examples, the switch 522 may be a further semiconductor switching device. The second terminal of the switching device 520 is operably coupled to the individual sensor 206 via channel 214, wherein the individual sensor 206 may be further coupled to ground 222.

In a first mode of operation, which may be a diagnostic mode of operation, a controller 524 enables the switching device 520, thereby allowing a supply current from the voltage supply 512 to be coupled to the individual sensor 206. In this diagnostic mode of operation when the wheel of a vehicle may not be in motion, the individual sensor 206 will not generate a toothed wheel current signal. However, when the vehicle is in motion, a toothed wheel current signal, e.g. toothed wheel current signal 402 from FIG. 4, as well as a leakage current represented by current source 526, may be output by the individual sensor 206. In some examples, the leakage current (represented in FIG. 5 by a current source 526) may emanate from the individual sensor 206, due for example to ageing. In known sensors, such a leakage current 526 may adversely influence the signal output by the current amplifier 502 to the comparator 504 on line 530, thereby affecting the accuracy of the sensor system.

In this example, the DAC 506 in cooperation with the controller 524 functions as a leakage current detector, in that a change in the sensor leakage current output 532 causes a comparable (analog) current level adjustment by the DAC 506 that is received by the controller 524 via connection 538, such that the controller 524 is informed of the leakage current represented by current source 526. For example where a leakage current of the sensor is tracked and compensated for, the DAC 506 outputs an analog compensation signal based on the digital 5-bit input from the sensor, for example, the 5-bits 0-1-1-0-1, in order to compensate for a tracked leakage current 526. That is:

$$I\text{-ref}=(7\text{ mA}+I\text{-compensation}) \quad [1]$$

where: I-compensation=I-leakage indicated by the 5-bits.

Thus, in one example, the DAC takes the input signal in the form of the 5-bits 507 and converts this input signal to an appropriate (analog) current compensation value output, which is added to the current source 'I-ref' 508. In some examples, the DAC 506 and controller 524 arrangement may simply monitor and/or track the individual sensor's current in order to determine a leakage current, or if the leakage current resides in a particular range in order to be compensated (for example ~−2 mA, +8 mA). Thereafter the controller 524 may compensate for the detected leakage current by applying an adjustment to the analog current compensated value via the reference line 534 input to the comparator 504.

The comparator 504 may be initially set up to be able to detect a transition between the low current state 7 mA values and high current pulse 14 mA values being drawn by the individual sensor 206 and represented by the rectangular wave toothed signal, by applying a 10 mA reference signal to second input 534 of the comparator 504. Thus, in some examples, the DAC 506 may be operable to track leakage current from the individual sensor 206, due to, say, aging, and in response to a change therein adjust the current source 'I-ref' 508 applied to comparator 504 and the controller 524 is informed of any change via connection 538.

In a second mode of operation, which may be an operational (e.g. moving vehicle) mode, the controller 524 may apply a control signal to the switch 522, in order to inject the test current 514 to the individual sensor 206. Notably, control signals to respective switches can be independently set to enable or disable an injected test current 514 to be applied to each sensor. With a test current 514 applied by closing switch 522, the sensor leakage current output 532 changes, and this change results in a modified 5-bit representation at the input of the DAC and subsequently a modified analog output signal applied to current source 'I-ref' 508. Notably, the modified analog output signal is also applied to controller 524, which is then able to determine whether the modified analog output signal accurately represents the injected test current 514. Alternatively, the controller 524 may determine that the modified analog output signal is not representative of the injected test current 514 due to, say, a short circuit between the sensor 206 and another sensor, or the sensor channel 214 and another sensor channel. In this manner, the controller 524 may be able to determine that a short circuit between the sensor 206 and another sensor, or the sensor channel 214 and another sensor channel, exists due to an unbalance between the test current that the controller 524 arranges to be injected into the sensor via control of switch 522 and the corresponding further compensated value that it receives from DAC 506 via connection 538.

During the second mode of operation, in response to the controller 524 enabling the switch 522 to operably inject the test current 514 to the individual sensor 206, the addition of the test current 514 may be viewed as a further leakage current that results in the modified set of bits 536 that are used to generate the further compensated current value.

Therefore, in some examples of the invention, the selective coupling of the test current 514 to the individual sensor 206 may cause the DAC 506 to register a change in its output in order to compensate for the coupled test current 514.

Further, in some other examples, which may relate to the second mode of operation, the DAC 506 may be operable to track leakage current in the range of around −2 mA to 8 mA. In this example, the leakage current range is not symmetrical, as generally the individual sensor 206 may sink less current at the start of its operating life, whereas the leakage current may gradually increase with age of the sensor, which may lead to a positive increase in leakage current. In some examples, the test current 514 may be limited to around 1 mA.

In some examples, the determination by the controller 524 of the effect on the sensor leakage current, by selectively applying the test current 514, may be independently performed by enabling and/or disabling the test current applied to each sensor via control of respective switch(es) 522.

Advantageously, the addition of the test current 514 does not adversely affect the operation of the sensing circuit 500, especially during the second mode of operation. For example, if the sensor leakage current is being compensated for by the DAC 506 and controller 524 arrangement, the nominal HIGH pulse level of 14 mA+α, LOW pulse level of 7 mA+α and threshold level of 10 mA+α (where α is the leakage current value) will be maintained. Hence, applying a low value test current 514 of the order of say 1 mA can be applied with the vehicle in motion with no adverse impact on the operation of the sensing circuit 500.

Thus, in some examples, the selective addition of the test current 514 may enable a short condition between at least two individual sensors and/or channels to be detected due to an unbalance between the test current that the controller arranges to be injected into the sensor via control of switch 522 and the corresponding further compensated value (equating to the modified set of bits 536) that it receives from DAC 506 via connection 538.

Figure 6:
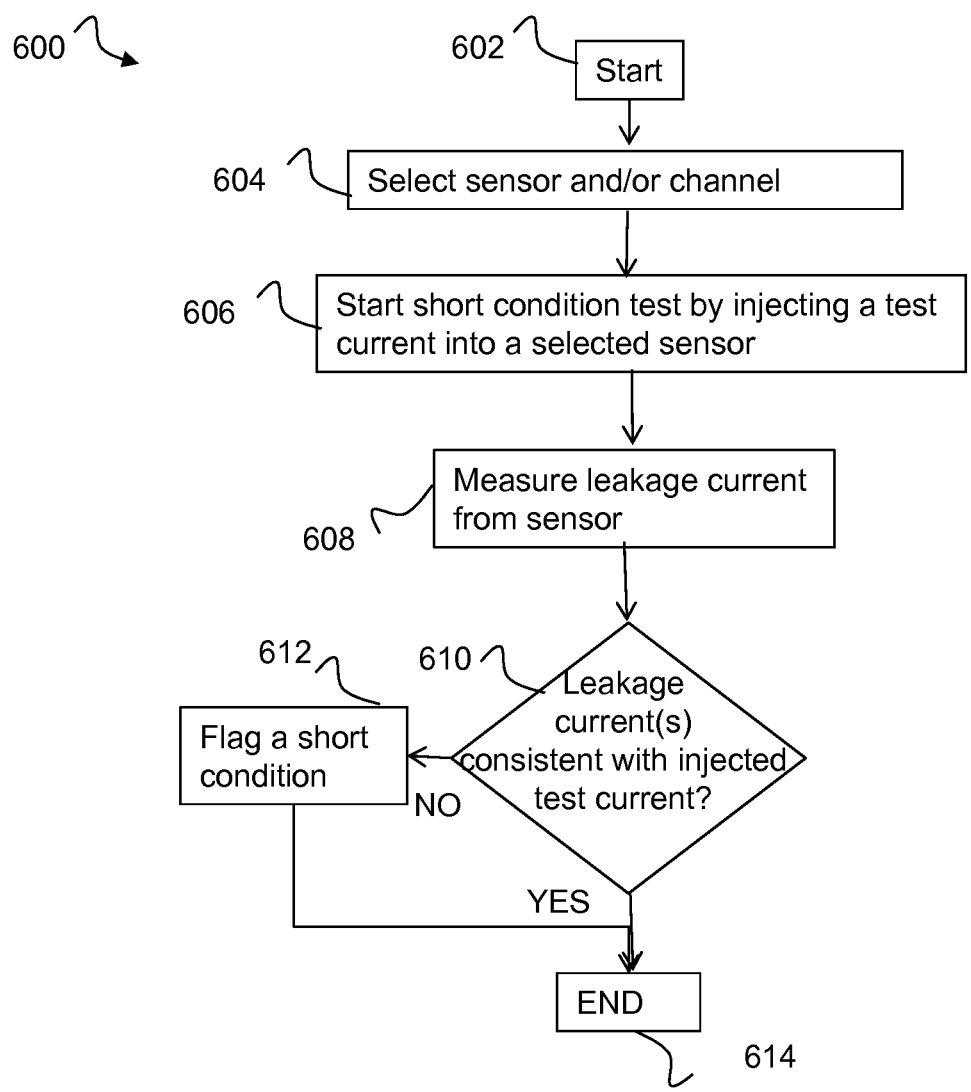
FIG. 6 illustrates an example flowchart operation of the sensing circuit from FIG. 5.

Referring to FIG. 6, a flow chart 600 illustrates an example operation of the sensing circuit of FIG. 5, according to some examples of the invention. The flow chart 600 illustrated in FIG. 6 may be utilised with any number of sensors and/or channels. However, for explanatory purposes, a four sensor-four channel system has been described. It should, however, be clear to a skilled person that the examples of the invention may be applied to a sensing circuit comprising any number of individual sensors and/or channels. In this example flowchart, a determination of whether or not a short condition may exist is made based on applying a test signal and monitoring a leakage current for a single sensor.

The example operation commences at 602. At 604, a first sensor and/or channel may be selected for injecting a test current, for example by a controller such as controller 524 of FIG. 5. In this example, the test current may be selectively injected into any selected sensor and/or channel and a short condition test started at 606. The controller then measures the leakage current emanating from the sensor at 608 and is able to determine whether a change in the leakage current is consistent with the injected test current at 610. If the leakage current is not consistent with the injected test current at 610, e.g. the controller determines there is an unbalanced leakage current in response to the injected current, then a short condition may be flagged at 612 and the process for that particular sensor ended at 614. If the leakage current is consistent with the injected test current at 610, then the controller may assume that there is no short condition associated with the selected sensor or its associated channel, and the process for that particular sensor ended at 614.

In some examples, the controller may then apply the same process to any other individual sensor and/or channel.

Figure 7:
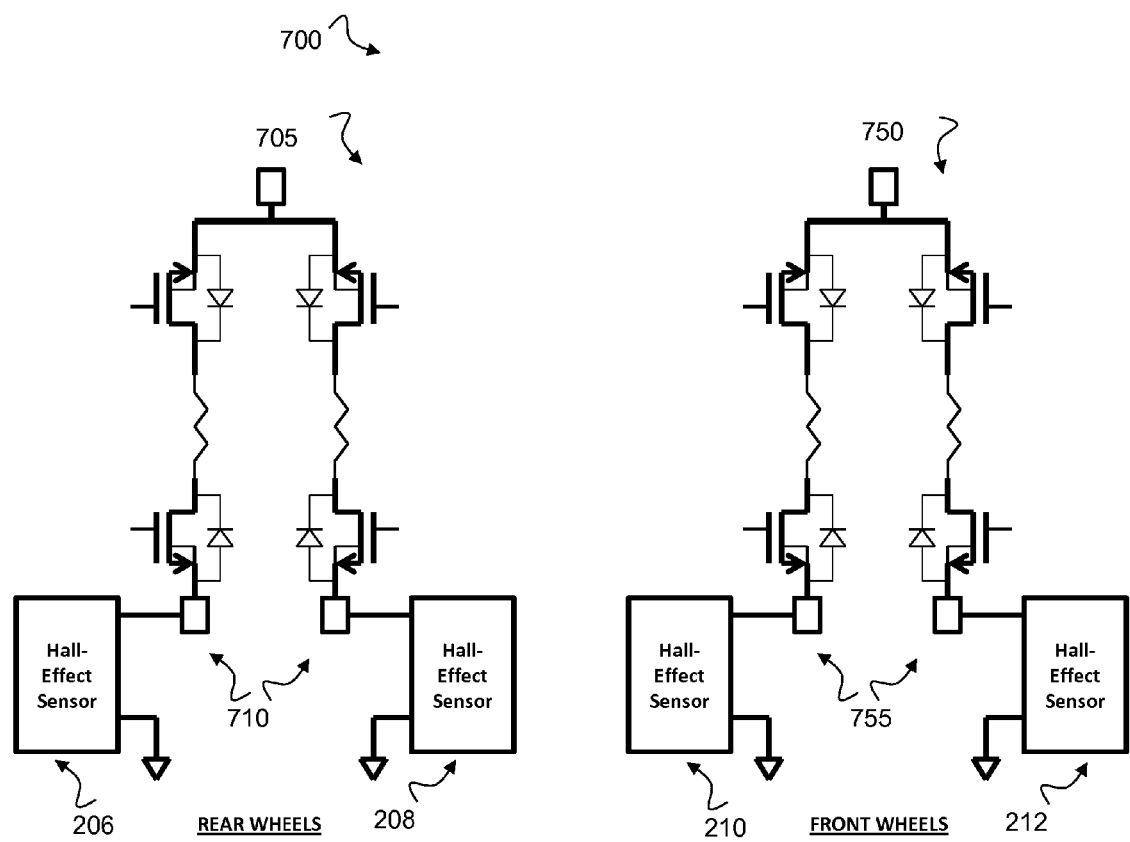
FIG. 7 illustrates an example of a vehicle with four wheel-speed sensor circuits with front and rear sub-modules.

FIG. 7 illustrates an example of a vehicle with four wheel-speed sensor circuits 700 with rear wheel sub-modules 705 and front wheel sub-modules 750. In this example, the wheel-speed sensor, and therefore the respective independent wheel-speed determinations, are implemented in two independent sub-modules (front/rear wheels), where each sub-module contains a dual analog sensor interface 710, 755. For failsafe purposes, the sensor interfaces 710 supporting the rear wheels are routed independently of the sensor interfaces 755 supporting the front wheels. In one example, all supplies, grounds, circuit biases, clocks and resets for these interface pairs may be routed independently, to avoid any undesirable performance effect from another sub-module or part thereof.

In some examples, therefore, the at least two sets of signal processing circuits for processing the sensor signal may be coupled to sensors 206, 208. In another example, the at least two sets of signal processing circuits for processing the sensor signal may be coupled to sensors 210, 212. In another example, the at least two sets of signal processing circuits for processing the sensor signal may be coupled to one sensor coupled to a rear wheel and one sensor coupled to a front wheel.

Figure 8:
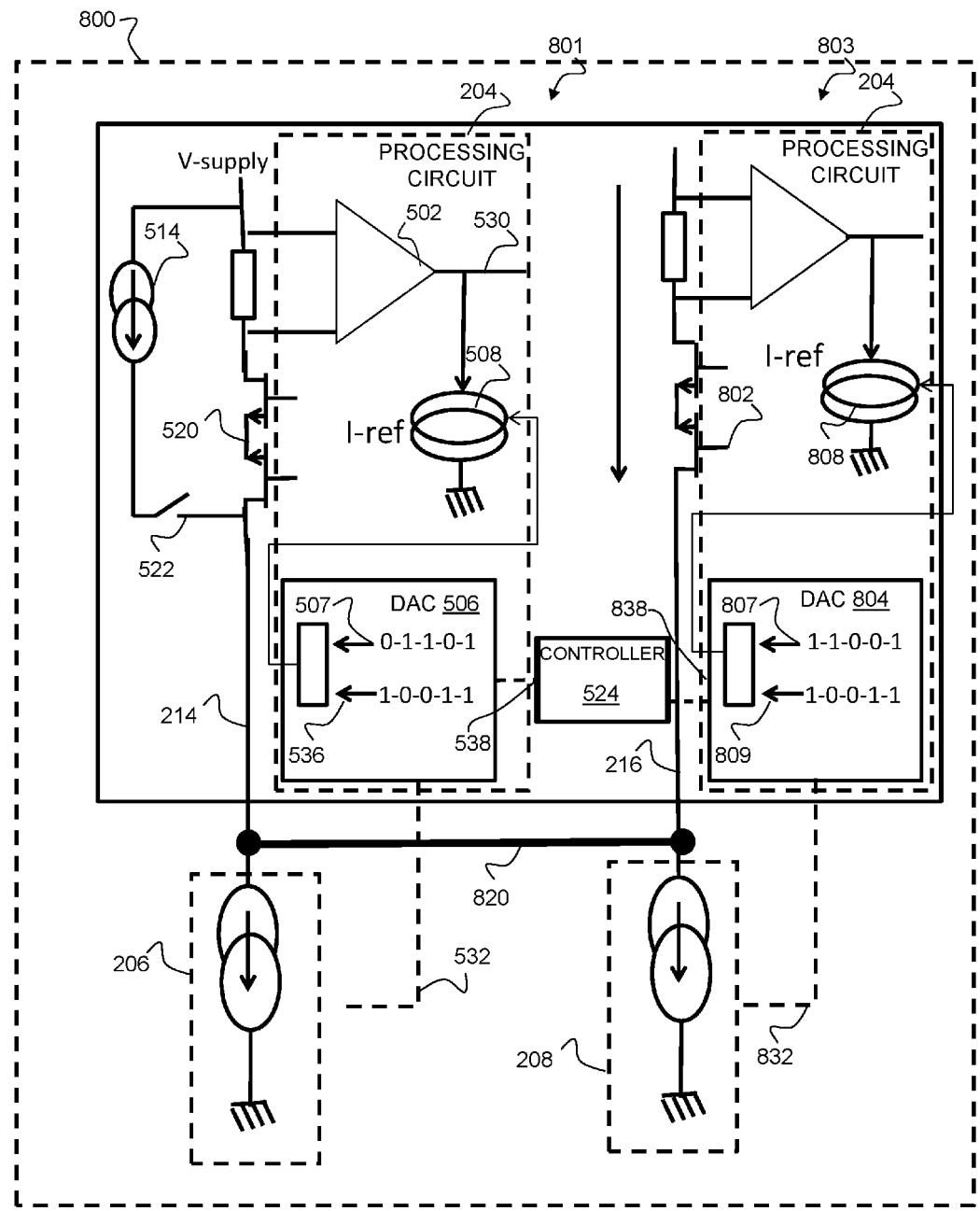
FIG. 8 illustrates a yet further example of a sensing circuit.

Referring to FIG. 8, a yet further example of a sensing circuit 800 is illustrated. In this example, the sensing circuit 800 may be employed in a vehicle, such as vehicle 300 from FIG. 3, as a wheel speed sensor circuit. In this example, a simplified schematic diagram 801 of the circuit of FIG. 5 has been incorporated with a second simplified schematic diagram 803 illustrating a further simplified sensing circuit comprising a further individual sensor and associated circuitry, the functionality of which will not be repeated herewith for the sake of clarity. Therefore, in this example, a second sensor 208 may be operably coupled via channel 216 to a third switching device 802. The output from second current source 'I-ref' 808 is controlled by a second level controller, which in this example comprises an analog output control signal from second digital-to-analog converter (DAC) 804, which receives a rectangular wave (representing a digital signal) input from the sensor 208. In other examples, the level controller may comprise any suitable component or circuit that is capable of monitoring a variation in current output from a sensor, particularly in response to an injected test current.

In this example, a short condition 820, represented by a connection between the first individual sensor 206 and/or channel 214 and the second individual sensor 208 and/or channel 216, is illustrated.

In some examples, the short condition 820 may not be a zero ohms short, but have an impedance value associated with it. In this example, the current may not be divided equally between the first individual sensor 206 and/or channel 214 that receives the test signal and the second individual sensor 208 and/or channel 216.

Again, in a first mode of operation, which may be a diagnostic mode of operation, DAC takes the input signal in the form of the 5-bits 507 and converts this input signal to an appropriate (analog) current compensation value output, which is added to the current source 'I-ref' 508. In this example, the first individual sensor 206 may be enabled via the switching device 520. As a result, the DAC 506 may be actively compensating for any sensor leakage current 532 by adjusting the current of I-ref 508. A similar operation may be carried out by the second DAC 804, wherein the second DAC may compensate for any sensor leakage current 832 emanating from the second individual sensor 208. However, in this example, the short condition 820 may adversely influence the output generated by the second DAC 804. Therefore, in some examples, an incorrect compensation value may be output via the second DAC 804, due to the short condition 820.

In some examples, a second mode of operation, which may be an operational (e.g. moving vehicle) mode and in order to detect the short condition 820, the controller 524 may be operable to monitor, via connections 538, 838 either the (analog) current compensated values output from the first DAC 506 and second DAC 804 respectively or the input signals in the form of the 5-bits 507, 807. In this second mode, the controller 524 applies a control signal to the switch 522, in order to inject the test current 514 to the individual sensor 206. Notably, control signals to respective switches can be independently set to enable or disable an injected test current 514 to be applied to each sensor. With a test current 514 applied by closing switch 522, the sensor leakage current output 532 changes, and this change results in a modified 5-bit representation at the input of the DAC and subsequently a modified analog output signal applied to current source 'I-ref' 508.

In this example, the test current 514 may be denoted as 'I-test'. Due to the short condition 820, a representation of the (I-test) test current 514 may also be seen at the second individual sensor 208. Thus, with a test current 514 applied by closing switch 522, the sensor leakage current output 832 from second sensor 208 also changes due to the short 820, and this change results in a modified 5-bit representation at the input of the second DAC 804 and subsequently a modified analog output signal applied to second current source 'I-ref' 808

In some examples, if the short condition 820 has zero impedance and the first individual sensor 206 and the second individual sensor 208 have close to equal impedances, the (I-test) test current 514 may be equally divided between the two individual sensors 206, 208. Therefore, a test current of I-test/2 may be additionally seen by the second DAC 804. The addition of a portion of the test current 514 may be viewed as a further leakage current that results in the modified set of bits 809 that are used to generate the further compensated current value to compensate for the additional test current. In this manner, the controller 524 may be able to determine that a short circuit between the sensor 206 and sensor 208, or the sensor channel 214 and sensor channel 216, exists due to a recognition of the fact that an injected test signal applied to the sensor 206 causes a change in the monitored out from the second DAC 804.

In some other examples, wherein the short condition 820 does not have zero impedance and/or the first individual sensor 206 and second individual sensor 208 do not have equal impedances, the second DAC 804 will see a different portion of the test current 514.

Therefore, some examples of the invention may allow the short condition 820 to be detected if, for example, a modified current is seen by the controller 524 on a sensor or channel that is not coupled to the test current 514, following the test current 514 being applied to another sensor.

In some examples, the controller 524 may be operable to determine the existence of the short condition 820 without having to determine an initial operating state of the first DAC 506 and second DAC 804, where the initial operating state already comprises any effect due to one or more leakage currents from the respective sensor.

In some examples, it may be necessary to test for the short condition 820 without affecting the operation of the remainder of sensing circuit 800, which in this example may be in the second mode of operation. Therefore, in some examples, the controller 524 may be operable to monitor the outputs from the first DAC 506 and the second DAC 804, respectively following the controller configuring switch 522 to inject the additional test current into sensor 206.

It should be noted that for clarity and ease of explanation, only one test current 514 is shown as being operably coupled to the simplified schematic diagram 801 in FIG. 8. In this example, only one test current 514 may be required to determine if a short condition 820 is present between the two individual sensors 206, 208 and/or channels 214, 216 of the sensing circuit 800, for example in a two-wheel vehicle sensor application. However, in some examples comprising more than two individual sensors and/or channels, more than one test current 514 may be required to determine if the short condition 820 is present between any combination of two individual sensors and/or channels, or a single test current 514 may be routed to multiple sensors or sets of wheel sensors. For example, in a sensing circuit comprising at least three individual sensors and/or channels, at least one test current may be required on each of at least two of the individual sensors and/or channels. In some examples, the at least two test currents may be substantially the same, wherein each test current may be individually enabled at separate times in order to determine if one or more short conditions 820 exist between at least two individual sensors and/or channels.

In some other examples, which may comprise a sensing circuit with at least four individual sensors and/or channels, a test current may be required on at least three of the individual sensors and/or channels.

Therefore, in some examples, the controller 524 may only need to determine that the output of the second DAC 804 has changed in response to an injected test current 514 applied to a sensor that is not operably coupled to the second DAC 804, in order to determine a short condition. Therefore, the controller 524 may monitor the output of the second DAC 804 before and after coupling the test current to determine a short condition, wherein a variation between the initial and subsequent outputs may be indicative of a short condition.

It should be noted that although the above mentioned summaries relate to a two sensor system, this is purely for ease of explaining some examples of the invention. As a result, any number of sensors can be checked for short conditions by applying examples of the invention.

In some examples, which may relate to vehicle safety applications, it may also be useful to check if the output of the first DAC 506 has changed in response to the test current being coupled to the first individual sensor 206. This may allow the consistency of the test current to be determined.

Figure 9:
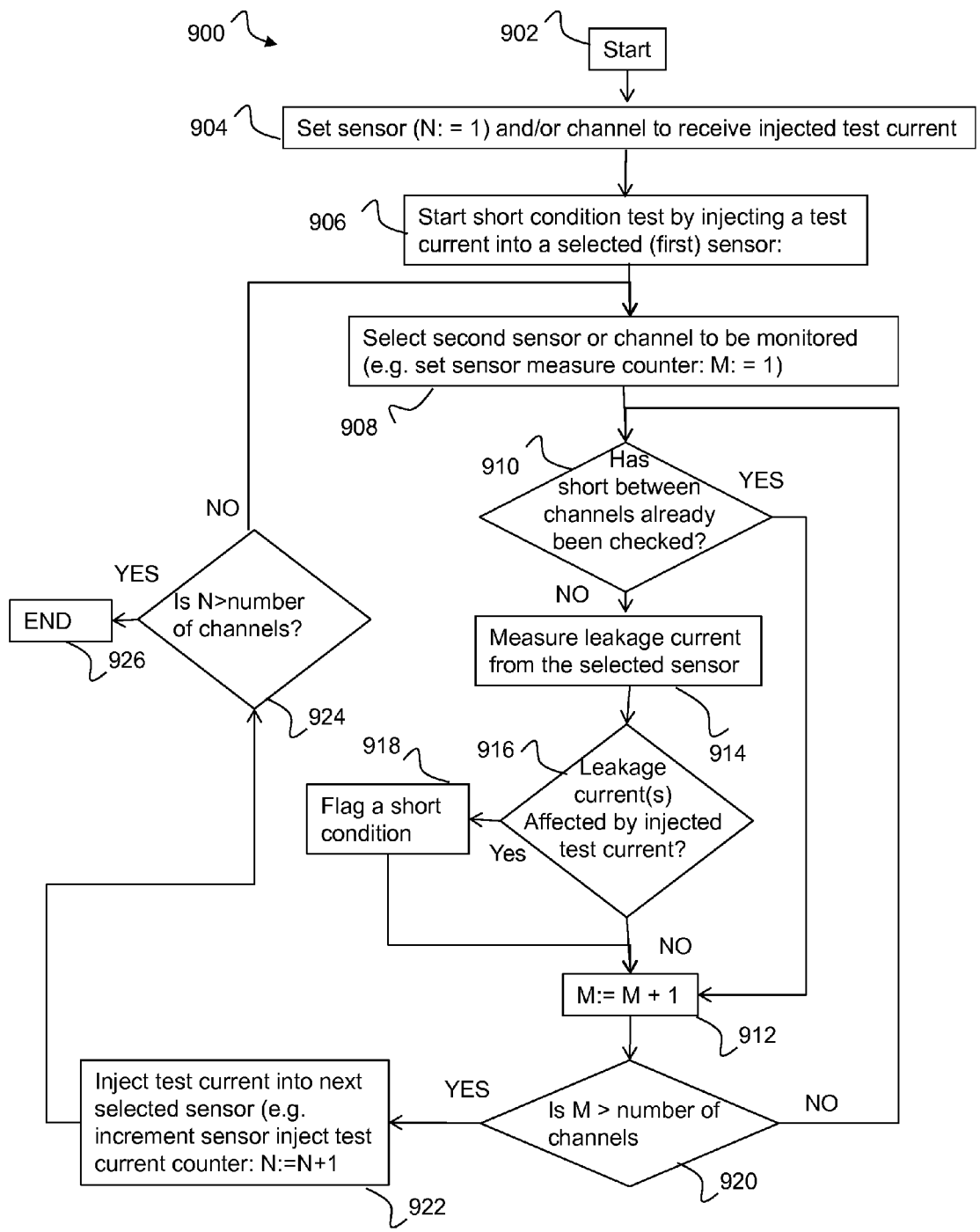
FIG. 9 illustrates an example flowchart operation of the sensing circuit from FIG. 8.

Referring to FIG. 9, a flow chart 900 illustrates an example operation of the sensing circuit of FIG. 7, according to some examples of the invention. The flow chart 900 illustrated in FIG. 9 may be utilised with any number of sensors and/or channels. However, for explanatory purposes, a four sensor-four channel system has been described. It should, however, be clear to a skilled person that the examples of the invention may be applied to a sensing circuit comprising any number of individual sensors and/or channels. In this example flowchart, a determination of whether or not a short condition may exist is made based on applying a test signal to one sensor and monitoring a leakage current of another sensor. Furthermore, in this example flowchart, a determination of whether or not a short condition may exist may be made based on applying a test signal to one sensor and monitoring a leakage current of one or more other sensor(s), and iteratively re-injecting a test signal to other sensors and re-monitoring leakage current of one or more other sensor(s).

The example operation commences at 902. At 904, a first sensor and/or channel may be selected, for example by a controller such as controller 524 of FIG. 8, for injecting a test current. In this example, the test current may be selectively injected into any selected sensor and/or channel, with the selected sensor denoted as 'N=1'.

At 906, a short condition test commences, wherein the controller selectively injects a test current, such as test current 514 from FIG. 8, to the selected sensor and/or channel denoted by N=1, which in this example may be the first individual sensor 206 and/or first channel 214 of FIG. 2.

At 908, a second (or further) sensor and/or channel may be selected for monitoring, for example by a controller such as controller 524 of FIG. 8.

At 910, the controller may optionally determine whether a short condition test has already been performed for the current combination of sensor and/or channel receiving the injected test current and the sensor and/or channel being monitored. If the controller determines that a short condition test has already been performed for this combination, the flowchart transitions to 912, where the controller starts monitoring the next sensor and M:=M+1.

The controller then measures the leakage current emanating from the second (or further) sensor at 914, as described with reference to FIG. 7. For example, the controller measures at 914 the leakage current of the second (or further) sensor for example by monitoring one or more current compensated values, output from a DAC not associated with the sensor receiving the injected current, and based on the corresponding sensor leakage current routed to the respective monitored DAC. Alternatively, the controller may be operable to monitor a digital bit-representation that is input to the DAC associated with the monitored sensor and receiving the corresponding sensor leakage current.

At 916, the controller may be able to determine whether the measured leakage current output from the selected monitored sensor is affected by the test current injected into a different selected (e.g. first) sensor. In some examples, this may allow a short to be detected for the tested sensor/channel. For example, the controller may determine at 916 whether there is a representation of the test current injected to sensor 'N' seen at another monitored sensor 'M'.

If the controller determines, at 916, that the monitored sensor 'M' leakage current is affected test current injected to sensor 'N', the controller may flag this as a short condition at 918. Otherwise, the process may transition to 912, if no short condition is detected for the current combination of 'N' and 'M', and another sensor monitored by M:=M+1.

In some examples, at 918, the outputted notification and/or flag may refer to a warning lamp being enabled to a user of the associated vehicle, when the sensor is used as a wheel speed sensor for a vehicle application. Further, the ABS and/or ESP may transition to a 'safe mode', wherein a user breaking may revert to a classical breaking regime not necessarily employing ABS and/or ESP.

If, at 920, the controller determines that the currently selected (for example the second) sensor and/or channel 'M' is greater than the total number of sensors and/or channels in the circuit, in this example four, the controller may transition to 922 and transition to another sensor to receive to injected test current (e.g. N:=N+1). Otherwise, if the controller determines that the currently selected monitored channel 'M' is less than or equal to the total number of sensors and/or channels in the circuit, the process transitions to 910 and repeats the above test procedure for the selected (new) monitored channel, with a new value for 'M'. In this example, this procedure is repeated until all required sensors and/or monitored channels have been tested for a short condition.

Once all required sensors and/or channels have been tested for a short condition for a test current injected into a particular sensor and/or channel 'N', the controller may, at 922, transition to the next sensor and/or channel in the sensing circuit (i.e. de-couple the test current 514 from the current (first) sensor and inject a test current to a next (e.g. second) sensor and/or channel.

At 924, the controller may determine whether the currently selected sensor and/or channel 'N' is greater than the number of sensors and/or channels in the sensing circuit. If this is the case, the controller may transition to 926, and end the short condition test. Otherwise, the controller may transition to 908 and commence the short condition test again with the currently selected sensor and/or channel (N) receiving the injected test current.

In some examples, performing some or all of the above mentioned method may allow checking for a short condition between every sensor and/or channel, in accordance with Table 1 below.

TABLE 1

| Channel-1 | Channel-2 | Channel-3 | Channel-4 | Short? |
|---|---|---|---|---|
| I-test applied | Check DAC coding variation | Check DAC coding variation | Check DAC coding variation | Detect whether Channel-1 short to other channels (ch2, ch3, ch4) |
| Check DAC coding variation | I-test applied | Check DAC coding variation | Check DAC coding variation | Detect whether Channel-2 short to other channels (ch1, ch3, ch4) |
| Check DAC coding variation | Check DAC coding variation | I-test applied | Check DAC coding variation | Detect whether Channel-3 short to other channels (ch1, ch2, ch4) |

Further, performing some or all of the above mentioned operations may allow one or more short conditions to be detected between at least two sensors and/or channels during the first mode of operation and/or the second mode of operation.

In some examples, therefore, detection of short circuits between, for example wheel speed sensor channels may be made. In some examples, such detection may be performed in a vehicle when the vehicle is in motion. In some examples, such detection of short circuits may increase safety of driving, by reducing or minimizing a potential for accidents due to an IC malfunction in the vehicle's electronics.

Figure 10:
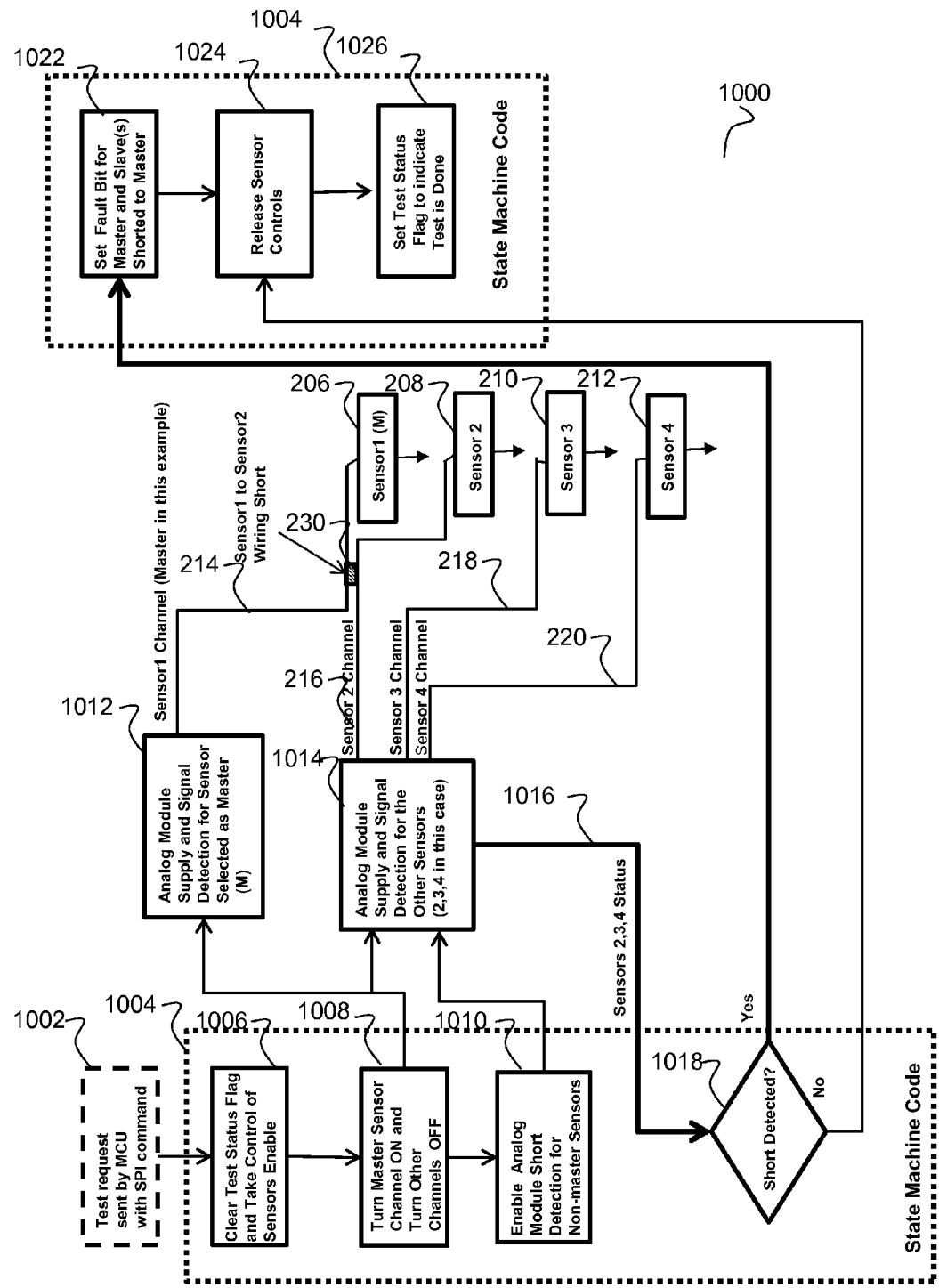
FIG. 10 illustrates a yet further example of a sensing circuit.

FIG. 10 illustrates a yet further example of a sensing circuit 1000. In this example, a digital state machine 1004 is used that provides the control in order to determine shorts between sensors and/or sensor channels, such as wheel speed sensor and/or sensor channels in a vehicle. In some examples, the use of a digital state machine 1004 may reduce a number of tasks performed by a processor or controller, such as controller 524 in FIG. 5 and FIG. 8, or limit the involvement of the processor or controller to just requesting a test and reading the results.

As in earlier examples, FIG. 10 illustrates a sensor to sensor fault check, rather than checking faults of a single sensor. In this example, any sensor or sensor channel may be selected as a master sensor channel to be tested against the other sensors for short condition testing. Such selection of a master sensor and/or master sensor channel may be made by the controller. The request of a short condition test may be sent by the controller to the digital state machine 1004 via a serial peripheral interface (SPI) command, as in 1002. In this example, the controller may request or initiate a short condition test to be performed at any time, including when applied to wheel speed sensors when the vehicle is in motion. The digital state machine 1004 will perform a check of the sensor that is selected as the master sensor against a plurality of other sensors in parallel and autonomously.

In one example, the digital state machine 1004 may, upon receiving such an SPI command 1002, clear a test status flag and take control of the plurality of sensors to perform the short condition test, as in 806. The digital state machine 1004 may then turn on a master sensor and master sensor channel and turn off the other sensors/channels, as in 1008. The supply and test signal may then be applied to the selected master sensor by a corresponding module in 812. In this example, the first sensor 206, connected to sensor channel 214, is selected as the master sensor to receive the test signal, such as test current 514 in FIG. 5 and FIG. 8.

The digital state machine 1004 enables/activates one or more analog current detector(s) 1014 coupled to the remaining sensors that are not selected as the master sensor, e.g. second sensor 208 via channel 216, third sensor 210 via channel 218, fourth sensor 212 via channel 220, etc., as in 1010. In this example, the one or more analog current detector(s) 1014 concurrently monitor(s) or measure(s) the current received on the channels 216, 218, 220. The one or more analog current detector(s) 1014 output a status of sensors 208, 210, 212 to the digital state machine 1004, which tests in 1018 for a short condition resulting from a test current applied to the selected master sensor 206 and master sensor channel 214. In this example, a short condition 230 is shown between first sensor 206 and channel 214 and the second sensor 208 and channel 216, which is determined by the digital state machine 1004. In response to a detection of a short condition in 1018, the digital state machine 1004 may set a fault bit indicating a short condition between the master sensor (e.g. first sensor 206) and a slave sensor (e.g. second sensor 208), as in 1022. Thereafter, or in response to no detection the of a short condition in 1018, the digital state machine 1004 may release the sensor control in 1024 and update a test status flag to indicate that the test has been completed, as in 1026.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device.

Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A sensor circuit, comprising:
at least two sets of:
a signal processing circuit connectable to a sensor to receive a periodic sensor signal therefrom, for processing the sensor signal;
a leakage current detector connected to the sensor to detect a leakage current of the sensors and connected to the signal processing circuit to output in response thereto a compensation signal for compensating for the leakage current;
the sensor circuit further comprising:
a test circuit connected to the sensors of the set for injecting a test current into a selected one of the sensors; and
a controller connected to the leakage current detectors for determining from the compensation signal of at least one of the leakage current detectors, whether a short condition exists between at least two of the sensors in response to the compensation signal being modified in response to the injected test current.

2. A sensor circuit, comprising:
at least two sets of:
a signal processing circuit connectable to a sensor to receive a periodic sensor signal therefrom, for processing the sensor signal;
a leakage current detector connected to the sensor to detect a leakage current of the sensors and connected to the signal processing circuit to output in response thereto a compensation signal for compensating for the leakage current;
the sensor circuit further comprising:
a test circuit connected to the sensors of the set for injecting a test current into a selected one of the sensors; and
a controller connected to the leakage current detectors for determining from the compensation signal of at least one of the leakage current detectors, whether a short condition exists between at least two of the sensors, and wherein the controller is arranged to determine whether the short condition exists between the at least two of the sensors in response to detecting an unbalanced current between the at least two of the sensors or a change in the test current.

3. A sensor circuit, comprising:
at least two sets of:
a signal processing circuit connectable to a sensor to receive a periodic sensor signal therefrom, for processing the sensor signal, wherein the signal processing circuit comprises:
   a comparator arranged to compare the level of the sensor signal with a threshold; and
   a level controller that controls a level of the sensor signal according to a detected leakage current, such that a highest level of the sensor signal stays above a threshold and the lowest level stays below the threshold in response to the compensation signal;
a leakage current detector connected to the sensor to detect a leakage current of the sensors and connected to the signal processing circuit to output in response thereto a compensation signal for compensating for the leakage current;
the sensor circuit further comprising:
a test circuit connected to the sensors of the set for injecting a test current into a selected one of the sensors; and
a controller connected to the leakage current detectors for determining from the compensation signal of at least one of the leakage current detectors, whether a short condition exists between at least two of the sensors.

4. The sensor circuit of claim 3, wherein the comparator is connected to a sensor circuit output connectable to a digital input of microcontroller, for providing a signal suitable for the microcontroller input.

5. A sensor circuit, comprising:
at least two sets of:
a signal processing circuit connectable to a sensor to receive a periodic sensor signal therefrom, for processing the sensor signal;
a leakage current detector connected to the sensor to detect a leakage current of the sensors and connected to the signal processing circuit to output in response thereto a compensation signal for compensating for the leakage current;
the sensor circuit further comprising:
a test circuit connected to the sensors of the set for injecting a test current into a selected one of the sensors; and
a controller connected to the leakage current detectors for determining from the compensation signal of at least one of the leakage current detectors, whether a short condition exists between at least two of the sensors, wherein the controller is arranged to determine that the short condition exists when a change in the test current applied to a first sensor in a first set out of said at least two sets is detected by the leakage current detector of a second set out of said at least two sets.

6. The sensor circuit of claim 5, wherein the controller is arranged to determine that a short condition exists when the leakage current detector in the second set outputs a different compensated value after the test current was coupled to the first sensor than before the test current was coupled to the first sensor.

7. The sensor circuit of claim 5, wherein:
the level controller comprises a digital to analog converter, DAC, connected to the sensor; and
the controller is arranged to compare a first compensation signal from a first DAC of the first set to a second compensation signal from a second set to determine whether a short condition exists between the first sensor in the first set and a second sensor in the second set.

8. The sensor circuit of claim 1, wherein the controller is arranged to correct the compensation signal in response to the injected test current.

9. The sensor circuit of claim 7, wherein in response to introduction of the test current into the sensor, the DAC is arranged to use a different bit coding to obtain said correction.

10. The sensor circuit of claim 1, wherein the controller determines that a short condition exists in response to a change in the compensation signal in a set.

11. The sensor circuit of claim 1, further comprising a switch operably coupled to the controller and arranged to perform selective addition of the test current to a current applied to at least the selected sensor.

12. The sensor circuit of claim 1, wherein the sensors are wheel speed sensors employed in a wheel speed sensor circuit.

13. The sensor circuit of claim 12, wherein the wheel speed sensors are applied to at least one from a group of: an anti-lock braking system, a traction control system.

14. The sensor circuit of claim 1, having an operational mode in which said sensors are operational, and a test mode in which said sensors are tested and wherein the test circuit and/or the controller are operable in said operational mode and/or said test mode.

15. A method for detecting a short circuit on a sensor system comprising at least two sensors, the method comprising:
selectively injecting a test current into a selected sensor of the at least two sensors;
receiving at least one second sensor signal from at least one other sensor than the selected sensor and outputting a second compensation signal to compensate for current leakage in the other sensor in response thereto, wherein receiving at least one second sensor signal from at least one other sensor than the selected sensor comprises receiving multiple second sensor signals from multiple other sensors than the selected sensory; and
determining from multiple second compensation signals whether a short condition exists between the selected sensor and at least one of the multiple other sensors.

16. A method for detecting a short circuit on a sensor system comprising at least two sensors, the method comprising:
selectively injecting a test current into a selected sensor of the at least two sensors;
receiving at least one second sensor signal from at least one other sensor than the selected sensor and outputting a second compensation signal to compensate for current leakage in the other sensor in response thereto;
determining from the second compensation signal whether a short condition exists between the selected sensor and the at least one other sensor;
disabling the test current from the selected sensor;
injecting a test current into a further selected sensor of the at least two sensors; and determining from the second compensation signal whether a short condition exists between the further selected sensor and the at least one other sensor.

* * * * *